United States Patent [19]

Kordus et al.

[11] Patent Number: 5,116,459

[45] Date of Patent: May 26, 1992

[54] PROCESSES FOR ELECTRICALLY CONDUCTIVE DECALS FILLED WITH ORGANIC INSULATOR MATERIAL

[75] Inventors: Mark R. Kordus, Pleasant Valley; Mark S. Schneider, Poughkeepsie; Louis H. Wirtz, Highland, all of N.Y.

[73] Assignee: International Business Machines Corporation, Armonk, N.Y.

[21] Appl. No.: 665,497

[22] Filed: Mar. 6, 1991

[51] Int. Cl.[5] .................... B44C 1/22; C23F 1/02; B29C 37/00

[52] U.S. Cl. .................... 156/631; 156/634; 156/652; 156/656; 156/659.1; 156/661.1; 156/901

[58] Field of Search ............... 156/629, 630, 631, 634, 156/650, 652, 656, 659.1, 661.1, 901, 902; 29/825, 876, 884; 174/250; 439/49; 361/397, 400

[56] References Cited

U.S. PATENT DOCUMENTS

| | | | |
|---|---|---|---|
| 2,692,190 | 10/1954 | Pritikin | 41/42 |
| 3,181,986 | 5/1965 | Pritikin | 156/233 |
| 3,541,222 | 11/1970 | Parks et al. | 174/68.5 |
| 3,683,105 | 8/1972 | Shamash et al. | 174/68.5 |
| 4,159,222 | 6/1979 | Lebow et al. | 156/632 |
| 4,604,160 | 8/1986 | Murakami et al. | 156/630 |
| 4,606,787 | 8/1986 | Pelligrono et al. | 156/632 |
| 4,707,657 | 11/1987 | Boegh-Peterson | 324/158 F |
| 4,753,694 | 6/1988 | Herron et al. | 156/89 |
| 4,879,156 | 11/1989 | Herron et al. | 428/137 |
| 4,926,549 | 5/1990 | Yoshizawa et al. | 29/876 |

OTHER PUBLICATIONS

G. Kraus, et al., "Process for Transferring Thin-Film Conductor Patterns to a Multilayer Ceramic Substrate for Semiconductor Chips", IBM Technical Disclosure Bulletin, vol. 27, No, 3, pp. 1404-1405 (Aug. 1984).

Primary Examiner—William A. Powell
Attorney, Agent, or Firm—Aziz M. Ahsan

[57] ABSTRACT

The present invention relates generally to new processes for making decals, and more particularly to electrically conductive decals that are filled with organic insulator material. Various methods and processes that are used to make these electrically conductive decals filled with organic dielectric materials are disclosed.

20 Claims, 4 Drawing Sheets

PROCESSES FOR ELECTRICALLY CONDUCTIVE DECALS FILLED WITH ORGANIC INSULATOR MATERIAL

FIELD OF THE INVENTION

The present invention relates generally to new processes for making decals, and more particularly to electrically conductive decals that are filled with organic insulator material, and herein after referred to as electrically conductive decals. Various methods and processes that are used to make these electrically conductive decals filled with organic dielectric materials are disclosed.

CROSS-REFERENCE

This Patent Application is related to U.S. patent application Ser. No. 07/665,633, entitled "Novel Processes for Electrically Conductive Decals Filled With Inorganic Insulator Material," and U.S. patent application Ser. No. 07/665,631, entitled "Novel Structures for Electrically Conductive Decals filled with Inorganic Insulator Material", and U.S. patent application Ser. No. 07/665,634, entitled "Novel Structures for Electrically Conductive Decals filled with Organic Insulator Material", which were filed concurrently on Mar. 6, 1991, and which are all assigned to the same assignee as this Patent Application, and the disclosure of all of them are incorporated herein by reference.

BACKGROUND OF THE INVENTION

Marketplace considerations have placed significant demands on packaging for increased circuit densities. New packaging concepts have evolved to meet these requirements utilizing processes that approach the levels of device technology.

Several new packaging methods have been developed to address this need, and one of them is the use of decals.

Decal technology initially relied on utilization of an adhesive that served a dual purpose: 1) bonding of the metallurgy foil and finished images to the carrier throughout the entire process, and 2) complete release of polymer and metallurgy at time of transfer to the substrate.

Early decals were produced from a three-part laminate. The process laminate was composed of a metallurgy layer in the form of a thin metal or alloy foil which was bonded to a polymer carrier with an adhesive. The adhesive also served as a release agent permitting separation from the carrier at time of transfer. Reliability of conductor release was assured because the surface energy of the polymer layer was much less than that of either the conductor or the substrate onto which the decal was transferred. See, for example, U.S. Pat. No. 4,879,156. These early solid conductors were generated from a photolithography and etching process.

Early work rapidly revealed a limitation of such decal systems to reliably achieve adequate feature locations. Movement of the images when compared to glass artwork was noticeable, and was found to emanate from absorption and desorption of process fluids. The film carriers in some cases either expanded or contracted depending upon their placement on the absorption isotherm when they were subjected to process ambients.

Having identified the limitations of organic polymers as carriers, work centered upon identification of material that maintained dimensional integrity throughout the process and could be used as a carrier.

The material selected to replace the unstable polymer was a metal foil, which was not subject to absorption of process liquids or deformation when exposed to elevated process temperatures.

Using such a metal foil in the laminate structure, it was rapidly learned that release of metallurgy from the metal foil carrier could not be accomplished uniformly. This was a result of equal bonding of the release adhesive to both metal surfaces, i.e., the metallurgy layer and the metal foil carrier.

To overcome this characteristic, the surface energy of the metal carrier was reduced to a level much less than that of the decal metallurgy and the substrate accepting the decal. Reliable release of the conductor metallurgy from the metal carrier would then be provided. The desired bonding characteristics were achieved by coating the surface of the carrier foil with a material, such as a polyimide, to restore the release properties of the original system. The metal carrier with a two-layer release agent was found to perform as well as the original carrier with respect to conductor transfer providing improved capability for feature locational accuracy.

Utilization of additive processes provides an alternate method for formation of conductors directly on a metal carrier. Use of plating or lift-off processes in conjunction with photolithographic processes allows for conductor generation in an additive manner. This technique provides a means for attaining increased package densities due to the inherent superior image formation capability of additive processes.

A simplified decal structure was developed enabling direct release of conductors from a metal carrier without the use of release agents. This technique was applicable to conductor generation by either additive or subtractive processes, and allowed for wider range of metals and alloys to be utilized as conductors. This has been discussed in U.S. Pat. No. 4,879,156.

Another packaging method is the intaglio printing process. Images are depressed below the surface of the printing plate such that an impression from the design yields an image in relief, as disclosed in U.S. Pat. No. 4,879,156. This technique can be utilized in packaging processes by etching of the conductor pattern into the surface of the metal carrier to a depth equal to the required thickness of the finished metallurgy followed by plating of the required metallurgy to form the conductors. This technique enables generations of conductors formed in a shape defined by the image recessed into the carrier.

There are several other techniques that have been used for packaging interconnection, such as one disclosed in U.S. Pat. No. 3,541,222, where a connector screen for interconnecting adjacent surfaces of boards or modules is disclosed. The connector screen comprises of conducting connector elements that are separated by a web of nonconducting material.

A connector assembly for a circuit board testing machine is disclosed in U.S. Pat. No. 4,707,657. An electrically insulating material having circuit tracks of an electrically conductive material is arranged on opposite side surfaces. The test points are electrically insulated from each other.

A process to form Multilayered Ceramic (MLC) Substrates, having solid metal conductors, is taught in U.S. Pat. No. 4,753,694. The MLC substrate involves, forming a pattern of solid, nonporous conductors to a backing sheet having a release layer, then transferring the pattern to a ceramic green sheet.

U.S. Pat. No. 4,926,549, discloses a method of producing electrical connection members. A carrier is formed on a first electrically conductive member, holes are etched in portions of the carrier to expose the first electrically conductive member and to form recesses therein. The recesses have a diameter larger than the diameter of the corresponding hole. The respective holes formed in the carrier are filled with a second electrically conductive material, and subsequently, the first electrically conductive member is removed from the carrier, thereby, leaving a carrier having a plurality of an electrically conductive material protruding out of the upper and lower surfaces of the carrier. The carrier having the plurality of electrical conducting protrusion can then be used to connect a semiconductor device to a circuit board.

IBM Technical Disclosure Bulletin, Vol. 27, No. 3, pp. 1404–1405 (Aug., 1984) discloses a process for transferring thin-film conductor patterns to a multilayer ceramic substrate. Conductive patterns are formed on a carrier. The conductive patterns are then completely blanketed by an insulator and holes are made in the insulator to expose the upper surface of the conductive pattern. The holes are then filled with an electrically conductive material and after securely attaching this assembly to a multilayer substrate, the carrier is removed.

One of the problems that has arisen in the earlier work is the formation of gaps at the interface between the vias, such as copper vias, and the insulator sidewalls, such as ceramic sidewalls. This kind of gap allows the infiltration and entrapment of fluids, especially during the post-sinter processing. As a remedy for this problem, polyimide backfilling of the gaps has being practiced. This process has its own inherent drawbacks, such as the lack of a good bond between the polyimide and the copper vias, and the difficulty in fully curing the polyimide which has infiltrated the interior of the substrate. These inherent drawbacks cause defects in the thin film redistribution structures which are subsequently deposited on the top surface of the substrate.

The top surface metallization feature sizes are limited by the present processing techniques. Additionally, the via gaps are being generated which is leading to a permeation problem in subsequent processing.

This invention provides a TFR (Thin Film Redistribution) decal structure having studs for via registration. This structure is laminated to the fired or sintered MLC substrate, thus providing "hermeticity". The process of this invention does not generate cracks in the substrates, such as in previous top surface processes. Fine line metallization is also achieved. Additionally, ready alignment of the top surface features to vias is achieved.

In this invention a process is also disclosed which does away with the thin film processing on ceramic substrates and utilizes novel etching techniques and decal structures in order to build the equivalent of thin film redistribution (TFR) after sintering.

The decal structure consists of redistribution lines, C4 (Controlled Collapse Chip Connection) pads on top of solid metal studs (acting as electrical interconnects) and EC (Engineering Change) pads. In this process, the electrically conductive decal filled with organic insulator material, such as a polymer, is laminated to either or both sides of a sintered substrate or an organic module to complete the top and/or bottom surface metallurgy.

This invention also focuses upon the effort to establish solid conductors that are transferable to substrates as a viable packaging approach.

This invention also describes several unique processing methods associated with the fabrication of solid transferable electrical conductors.

OBJECTS AND SUMMARY OF THE INVENTION

The invention is a novel method for making electrically conductive decals without impacting the structural integrity of the package, or the functionality of the device or devices.

One object of this invention is to make an improved electrically conductive decal.

Another object of this invention is to make an improved electrically conductive decal that has electrical lines, studs, stud connections, C4 pads, and the like.

Still another object of this invention is to make a plurality of electrically conductive decals that can be stacked and joined to one another.

Another object is to make an electrically conductive decal that can be secured to a substrate.

Another object of this invention is to provide a hermetically sealed package, once the electrically conductive decal of this invention is secured to a substrate or a module.

Still another object of this invention is to provide an insulating layer with electrical interconnects.

Yet another object of this invention is to provide an electrically conductive decal that can be tested prior to being joined to a substrate or a module.

In one aspect this invention comprises a process for making an electrical connection member, comprising the steps of:

a) forming an electrically conductive substrate comprising a first electrically conductive material and a second electrically conductive material, wherein the first material and the second material sandwich at least a third electrically conductive material therebetween, and wherein the material for the third electrically conductive material is different than the material for the first and second electrically conductive materials, b) patterning and etching the first electrically conductive material to expose at least a portion of the third electrically conductive material and to form at least one first island of the first electrically conductive material, c) securing a backing material to the at least one first island, d) patterning and etching the second electrically conductive material to expose at least a portion of the third electrically conductive material and to form at least one second island of the second electrically conductive material, wherein the at least one second island is opposite the at least one first island, e) removing the exposed third electrically conductive material, f) filling the area created by the removal of the third electrically conductive material with an organic insulator material, such that at least a portion of the at least one second island is surrounded by the organic insulator material, and g) removing the backing material and thereby forming the electrical connection member.

In another aspect this invention comprises a process for making an electrical connection member, comprising the steps of:
a) forming an electrically conductive substrate comprising a first electrically conductive material and a second electrically conductive material, wherein the first material and the second material sandwich at least a third electrically conductive material therebetween, and wherein the material for the third electrically conductive material is different than the material for the first and second electrically conductive materials,
b) patterning and etching the first electrically conductive material to expose at least a portion of the third electrically conductive material and to form at least one first island of the first electrically conductive material,
c) securing a backing material to the at least one first island,
d) patterning and etching the second electrically conductive material to expose at least a portion of the third electrically conductive material and to form at least one second island of the second electrically conductive material, wherein the at least one second island is opposite the at least one first island,
e) removing the exposed third electrically conductive material to form a third island which is cladded by the at least one first island and the at least one second island,
f) filling the area around the first island, the third island, and the second island with an organic insulator material, such that at least a portion of the first island and the second island is surrounded by the organic insulator material, and
g) removing the backing material and thereby forming the electrical connection member.

In yet another aspect this invention comprises a process for making an electrically conducting package, comprising the steps of:
a) forming an electrically conductive substrate comprising a first electrically conductive material and a second electrically conductive material, wherein the first material and the second material sandwich at least a third electrically conductive material therebetween, and wherein the material for the third electrically conductive material is different than the material for the first and second electrically conductive materials,
b) applying a photoresist on the first and the second electrically conductive material and patterning the photoresist,
c) etching the first electrically conductive material through the patterned photoresist to expose at least a portion of the third electrically conductive material and to form a plurality of first islands from the first electrically conductive material,
d) removing the photoresist from the surface of the first islands,
e) applying a blanket layer of an adhesive over the first islands,
f) adhering a backing material to at least one of the first islands by means of the adhesive,
g) etching the second electrically conductive material through the patterned photoresist to expose at least a portion of the third electrically conductive material and to form a plurality of second islands from the second electrically conductive material, wherein at least one of the second islands is opposite at least one of the first islands,
h) removing the photoresist from the surface of the second islands,
i) removing the exposed third electrically conductive material,
j) filling at least the area created by the removal of the exposed third electrically conductive material with an organic insulator material such that at least a portion of one of the islands is surrounded by the organic insulator material,
k) securing at least one of the second islands to an electrically conducting module, and
l) removing the backing material and the blanket layer of adhesive, to form the electrically conducting package.

Still another aspect of this invention comprises an electrical connection member comprising at least one first electrically conductive island, at least one second electrically conductive island, and wherein at least one of the first and the second islands has at least one third electrically conductive island therebetween, wherein the material for the third island is different than the material for the first and second islands, and wherein the third island and at least a portion of one of the islands is surrounded by an organic insulator material.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

This invention describes various methods of making electrically conductive decals that are filled with an organic insulator or dielectric material.

The solid circuit patterns discussed in this patent application are referred to as decals, which are defined as pictures, designs or labels printed on specially prepared material to be transferred to another material. These electrically conductive decals will also be referred to as electrical connection members.

Conductive decals are patterns generated in a metallurgy system on a carrier having surface characteristics permitting release of the conductors from the carrier onto a suitable substrate or dielectric, such as a multilayered ceramic (MLC) package. Through the decal transfer process, a permanent bond is achieved by controlled lamination to a fired ceramic substrate or to an organic substrate, such as a polymer substrate.

This invention allows the formation of individual decals or composite layers that can be fabricated for the top surface personalization of a substrate. This can be considered as an alternative to thick film conductors in the multilayered ceramic (MLC) module.

Another significant advantage of this technique is improvement in fine line capabilities. With this technique, conductors can be reduced in size and an increase in wiring density can be achieved. This technique is also capable of providing conductors closer in resolution to that of the underlying artwork. The outcome of this capability is improved potential for increased circuit densities.

Some other advantages of the present invention are:
a) Self-aligned electrical connection member where the metallurgy on both sides of the etch-stop material are aligned and set and will not move.
b) Novel decal structure with built-in etch barrier in order to define studs connection, studs and fine lines by etching.
c) The bond between the organic, such as a polymer, decal and the fired substrate provides a seal to prevent the infiltration of fluids during additional processes.
d) No post-sinter planarization is necessary.
e) No organic backfill is necessary in order to seal vias in glass-ceramic substrates.
f) Pattern-registration to remainder of substrate is made easier, as decal studs only have to capture the bottom vias by 50 percent of stud area, as there are no circuit lines to interfere at this surface of the decal.
g) The double-sided photolithography exposure step, insures alignment of studs to TFR pattern.

Figure 1:
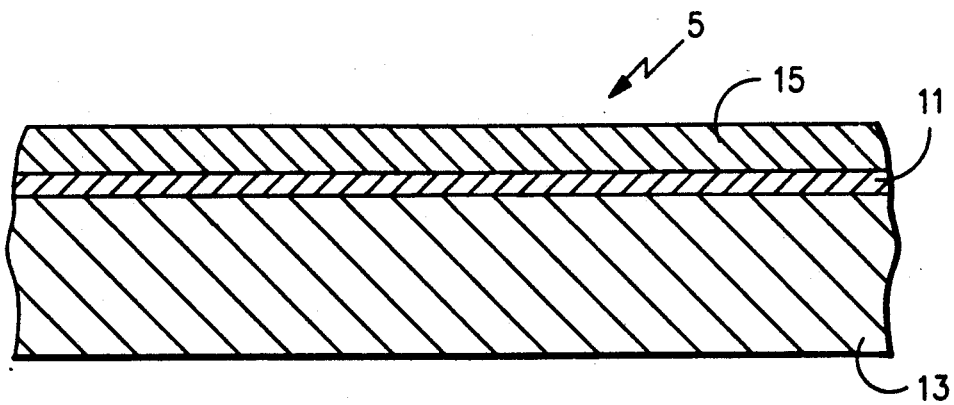
FIG. 1, illustrates a decal base having an electrically conductive etch-stop layer.

FIG. 1, illustrates a tri-metallic structure referred to as a work piece or a decal base 5. The decal base 5, is a three metal layer sandwich with the middle layer being an etch barrier or an etch-stop layer 11, surrounded by two electrically conductive metal layers 13 and 15. The etch barrier or etch-stop layer 11, is an electrically conductive material, and it is any material that will allow the preferential etching of the other two metal layers 13 and 15, that are cladding or sandwiching the etch-stop or the third layer 11. The purpose of the etch barrier 11, will be described later in this section. The etch-stop layer 11, should be of sufficient thickness to prevent the permeation of undesirable etchants. Suitable materials for the etch-stop layer are materials that are selected from a group comprising aluminum, chromium, copper, gold, molybdenum, nickel, palladium, platinum, silver, titanium, tungsten, or alloys thereof.

The two outside layers of electrically conductive material 13 and 15, may be of the same or different material, depending on the end result that is desired. Suitable materials for the electrically conductive metal layer 13 and 15, are materials that are selected from a group comprising aluminum, copper, gold, iron, molybdenum, nickel, tungsten, or alloys thereof. Similarly, the two outside layers 13 and 15, may be of the same or different thickness, again this would depend on how these layers are going to be utilized in the end package. For the purposes of illustration only, it is being shown that the metal layer 15, is thin and the metal layer 13, is thick, but any variation in the top to bottom thickness can be used to achieve the desired decal profile.

The workpiece or the decal base 5, as seen in FIG. 1, can be made by a number of conventional methods, such as, cladding, coating, evaporation, plating, sputtering, or any other suitable method. The combination of any of these processes may also be employed to build the decal base 5. Any of these methods can further be used to obtain the required conductor thickness. One layer of the decal base 5, could be used as the starting layer (or carrier) so that the other two layers could be formed onto it. Also the etch barrier 11, could be used as the starting point and the outside layers 13 and 15, may be formed simultaneously or sequentially to it. This decal base 5, will provide dimensionally stable structures throughout the process.

Figure 2:
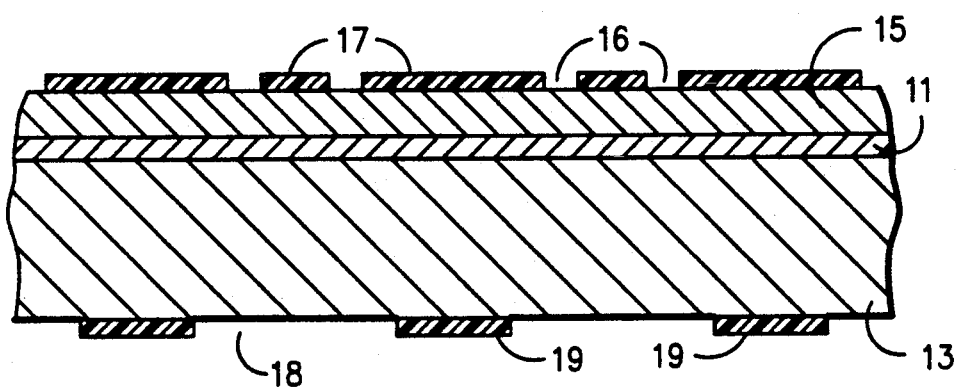
FIG. 2, illustrates the decal base having a resist pattern on both surfaces.

FIG. 2, illustrates the decal base 5, having a resist pattern on both surfaces. Once the decal base 5, has been completed, photoresist 17 and 19, is applied to the exposed surfaces of the electrically conductive material 13 and 15. This application of the photoresist 17 and 19, can be done by either a wet or a dry process, for example, by dipping, electrophoresis, lamination, rollercoating, spinning, spraying, or any combination of these processes. The photoresist 17 and 19, may be a negative or positive photoresist depending on photomask used and the end result that is desired.

Two photomasks having desired patterns are aligned to each other and then the decal base 5, having the photoresists 17, and 19, is placed between the aligned photomasks, and the photoresists 17 and 19, are exposed. The photomask may consist of a circuit pattern or a through-via pattern, or a combination of both, or other electrical features, such as studs and stud connections. The photoresists 17 and 19, may be exposed simultaneously or sequentially. It is preferred to expose both sides of the decal base 5, at the same time to assure alignment. Similarly, the two sides can be developed simultaneously or sequentially depending on the photoresist combination. The photoresist is developed by any suitable technique, such as, dipping, spraying, etc. The photoresist remaining after developing will define the final images of the circuit pattern and/or studs and stud connections. As seen in FIG. 2, the photoresist patterns 17, and 19, have holes or open areas 16, and 18, respectively, from where the electrically conductive materials 15 and 13, will be removed during subsequent processing.

Figure 3:
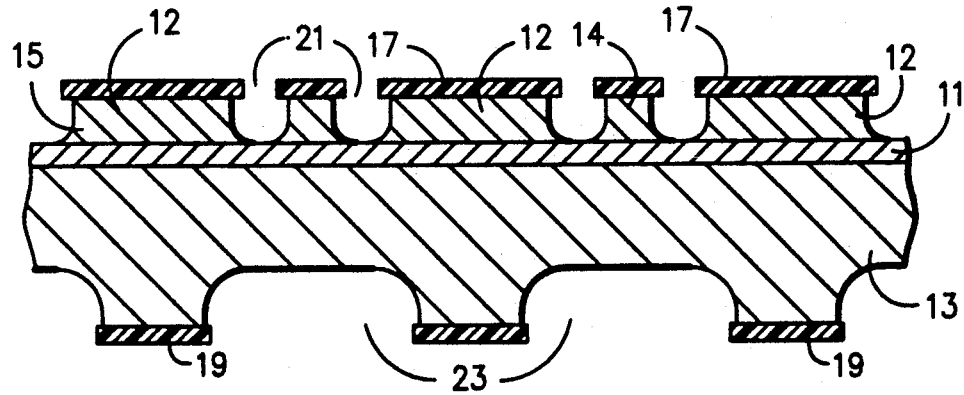
FIG. 3, illustrates the partial etching of the decal base to expose the etch-stop layer on the thin electrical conductor side.

FIG. 3, illustrates the partial etching of the decal base 5. The exposed electrically conductive materials 13 and 15, in the imaged decal base 5, is removed by conventional etching processes such as electrolytic, chemical, or dry etching. By using dissimilar metals or metals of varying thicknesses as the electrically conductive materials 13 and 15, the etch-stop layer 11, will be exposed on one side after the partial etch. This is usually the thinner electrically conductive metal side which can contain the circuit patterns and the stud connection or it is the electrically conductive metal side that is being etched first. The side opposite the side where the etch-stop 11, is exposed is either partially etched through or etched all the way to the etch-stop layer 11. This depends upon the ratio of thicknesses of the two outside electrically conductive metal layers. The etch-stop layer 11, allows the two outside layers to be processed individually or at the same time. This has the benefit of allowing one to produce patterns of varying densities on the two sides or improve aspect ratio (ratio of image size to thickness) of the image. The first etching of the electrically conductive materials 13 and 15, is stopped when the upper side is etched through the openings 16, and after the etch-stop layer 11, is exposed. This forms openings 21, that define the stud connection 12, and circuit lines 14. This etched metallurgy is also referred to as islands. The etching material or process that is used should be a suitable etching material or process so as to attack only the desired material and features. As can be seen in FIG. 3, which shows on the upper side of the decal base 5, the defined circuit lines 14, and stud connection 12. The etching of the thin electrically conductive metal layer 15, should continue until there is no material electrically connecting the stud connection 12, and the circuit lines 14, to each other except through the electrically conductive etch barrier 11. Because simultaneous etching was used, the lower side of the decal base 5, has been exposed to only define openings 23.

Figure 4:
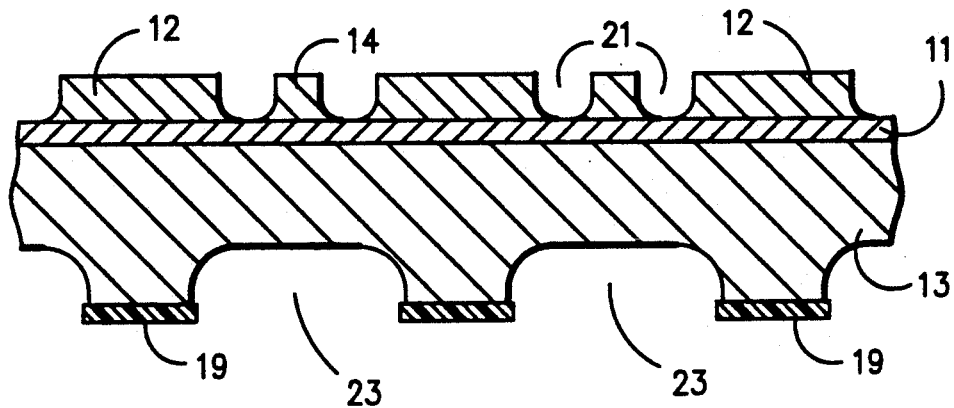
FIG. 4, illustrates the removal of the resist from the upper surface of the thin electrical conductor.

FIG. 4, illustrates the removal of the resist 17, from the upper surface of the decal base 5. The photoresist 17, is removed from the upper side by any suitable stripping technique. Again, care should be taken to use a suitable stripping process to attack only the photoresist 17, and not to damage or remove photoresist images 19.

Figure 5:
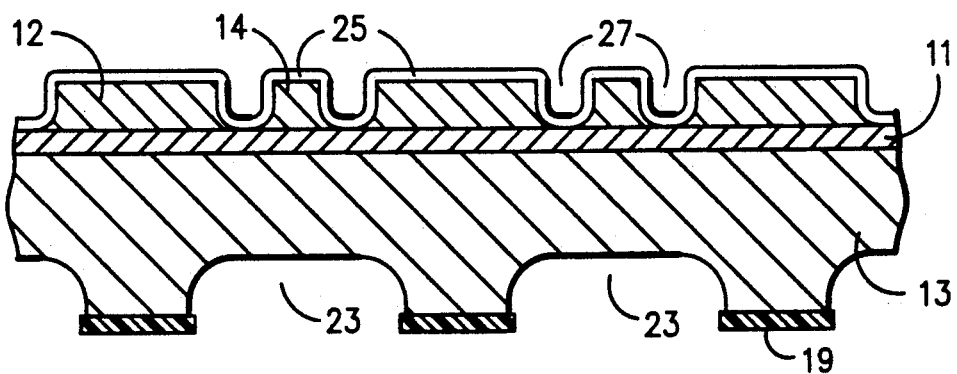
FIG. 5, illustrates the application of an adhesive release agent on the upper surface of the partially etched decal base.

FIG. 5, illustrates the application of an adhesive release agent 25, on the upper surface of the partially etched decal base 5. The upper side could be sprayed with a suitable adhesive release agent 25, such as PMMA (polymethylmethacrylate). The adhesive release agent 25, is applied on the upper surface of the etched decal base 5, using rollercoating, spinning, or spraying techniques, to name a few. The adhesive release agent 25, will conform to the etched surface, such as filling the openings 21, and forming openings 27.

Figure 6:
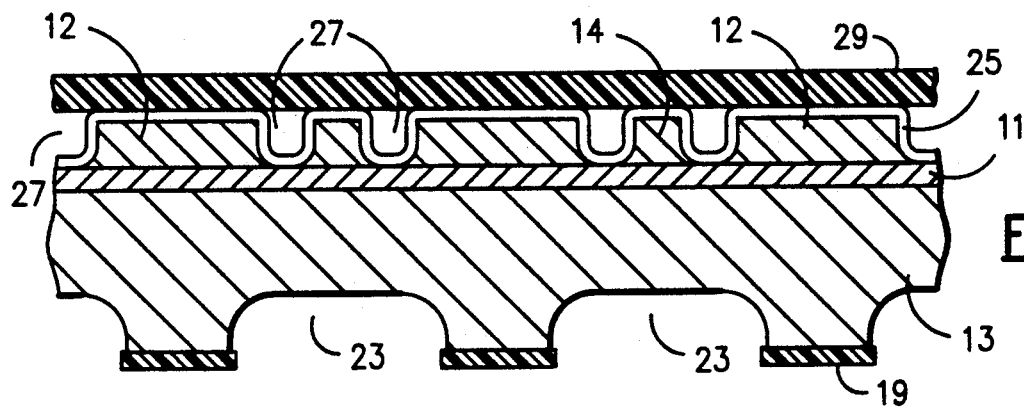
FIG. 6, illustrates the securing of a carrier to the adhesive release agent on the partially etched decal base.

FIG. 6, illustrates the securing of a backing material or a carrier 29, to the adhesive release agent 25, of the partially etched decal base 5. The carrier 29, can be any suitable polymer or metal, as long as it will adhere to the adhesive release agent 25. For example, if a polymer is used as the carrier 29, then a polyester or a polyimide material could be used as the carrier 29. On the other hand, if a metal is used as the carrier 29, then the carrier 29 should be coated with a polymer, such as polyimide, on one or both sides or at least the surface that will contact the adhesive release agent 25, that is already on the decal base, to insure release of the carrier 29, from the decal base 5, during subsequent processing.

A suitable material for a metal carrier 29, is copper. The primary function of the adhesive release agent or layer 25, is to hold the carrier 29, to the partially etched decal base 5, and to allow the carrier 29, to be removed from the decal base 5, in subsequent processing. The carrier 29, serves two purposes, the first is as a mechanical support for the etched decal base 5, and secondly as an etch barrier for one side of the decal base 5, allowing the opposite side of the decal base 5, to be processed further. The only time the carrier 29, is needed as an etch barrier is when similar metals are being used as the electrically conductive metals 13 and 15. The carrier 29, can be secured to the etched workpiece or decal base 5, on the side that the adhesive release agent 25, is on by any suitable means, such as lamination, heat or pressure, etc.

Figure 7:
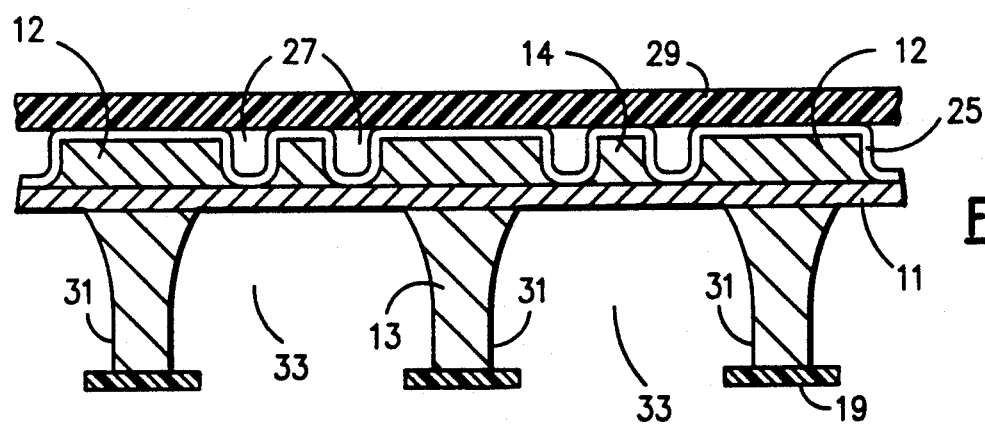
FIG. 7, illustrates the complete etching of the thick electrical conductor side of the decal base.

The complete etching of the lower surface of the decal base 5, is now illustrated in FIG. 7. With the photoresist 19, and the carrier 29, protecting the desired images, the decal base 5, is now etched a second time until the bottom surface of the etch-stop layer 11, is exposed. This second etching step creates the openings 33, and forms the studs or interconnections 31. This etched metallurgy is also referred to as islands. This etching of the lower side of the decal base 5, can be done by conventional means, such as, chemical, electrolytic or dry etching.

Figure 8:
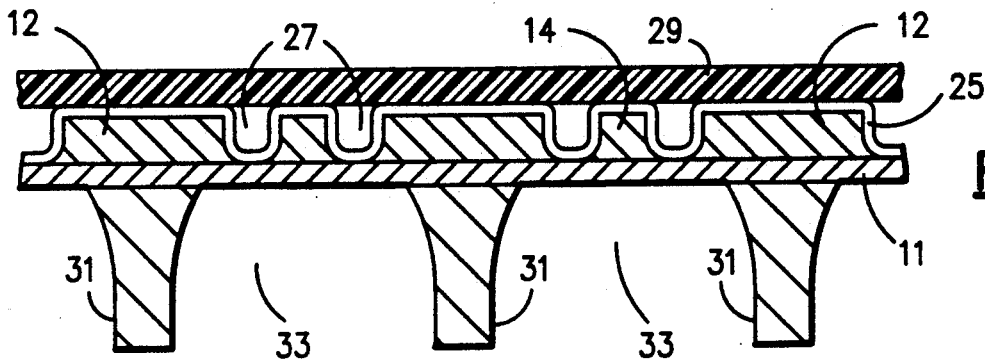
FIG. 8, illustrates the removal of the photoresist from the surface of the thick electrical conductor.

FIG. 8, illustrates the removal of the photoresist 19, from the decal base 5. This is typically accomplished by wet techniques, such as, re-expose and develop, or chemical strip, or by dry techniques, such as, RIE or ashing.

Figure 9:
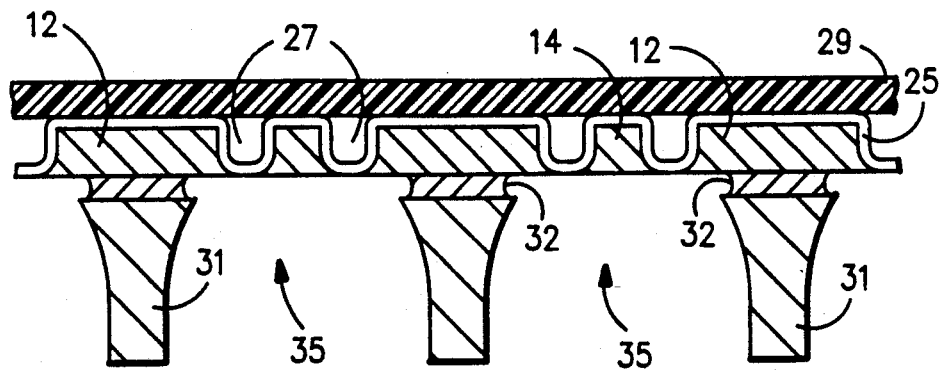
FIG. 9, shows the etching away of the exposed etch-stop layer.

FIG. 9, shows the final etching of the decal base 5, by etching away the exposed etch-stop layer 11, to form the etch-stop interconnection or island 32. The etch-stop interconnection 32, electrically connects the stud connections 12, to the studs 31. This etching expands the openings 33, to form openings 35. The removal of the etch-stop layer 11, can be accomplished by chemical, electrolytic or dry etching. The removal of the etch-stop layer 11, isolates all the formed electrical interconnects, thus preventing shorting of the via studs 31, and the circuit lines 14.

Figure 10:
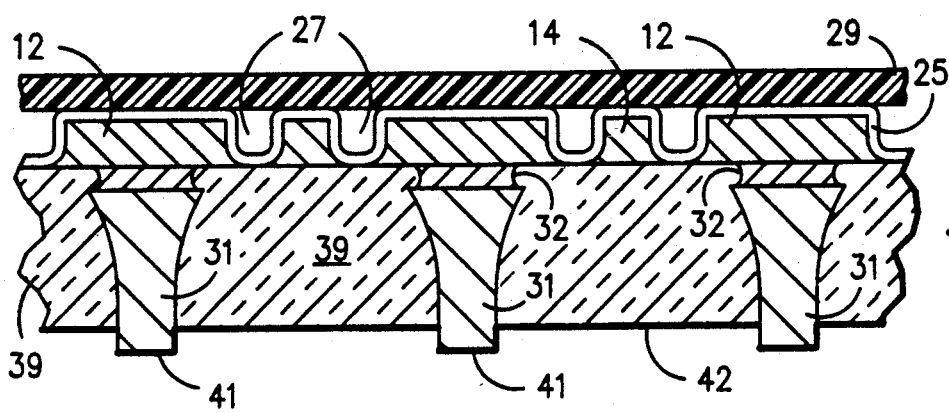
FIG. 10, illustrates the filling of area between the thick electrical conductors of the decal base with an organic dielectric material.

FIG. 10, illustrates the filling of the openings 35, in the fully etched decal base 5, with a slurry of an organic dielectric material 39. The organic insulator material 39, must completely surround the etch-stop interconnection or island 32, and should surround at least a portion of either the stud connection 12, or the stud 31, or both, to prevent electrical shorting between neighboring electrical members. The organic insulator material 39, can be selected from a group comprising abs, fluoropolymers, phenolics, polycarbonates, polyesters, polyimide, polyolefins, polyvinylidinefluoride, silicones, unsaturated linear aliphatics, urethanes, vinyls, plastics or compounds thereof. This filling of the openings 35, can be done by rollercoating, spraying, spinning, etc. The thickness of the organic dielectric material 39, should be no more than the height of the studs 31. During coating, some of the organic dielectric material 39, may cover the top surface 41, of the studs 31, which can be removed by methods well known in the art, such as by planarization or dry-etching. The end 41, of the via studs 31, may protrude above the surface 42, of the organic dielectric material 39, or it may remain flushed with the surface 42, of the organic dielectric material 39. This can be accomplished by proper coating techniques, planarization, or by dry etching process.

Figure 11:
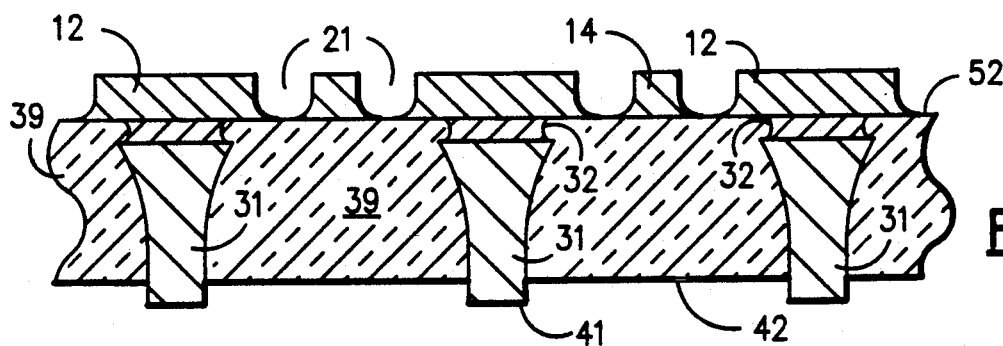
FIG. 11, illustrates one embodiment of the completed electrically conductive decal of this invention.

One embodiment of the final completed electrically conductive decal filled with organic insulator material structure of this invention is illustrated in FIG. 11. The backing material or carrier 29, and the adhesive release agent 25, have been removed and this completed decal structure can now be joined to any substrate that will not be sintered. The carrier or backing material 29, is normally removed from the decal by peeling. The adhesive release agent 25, that remains on the decal can now be easily removed with a suitable solvent. The solvent that is used to remove the left-over adhesive release agent 25, will primarily depend upon two factors, the first being the chemical composition of the adhesive release agent 25, and secondly, upon its effect on the decal structure. After the removal of the adhesive release layer 25, and the carrier 29, the lower surface 42, and the upper surface 52, of the dielectric material 39, are exposed for further processing. As can be clearly seen in FIG. 11, that this stand-alone electrically conductive decal can be tested prior to further processing. This testing could include checking for electrical continuity or structural integrity, to name a few. This feature has a distinct advantage of allowing for pre-testing both the electrically conductive decal and the substrate, layer, module or package to which it will be secured prior to any joining. By doing a pre-test prior to any joining, one can reduce defects in the final product.

Figure 12:
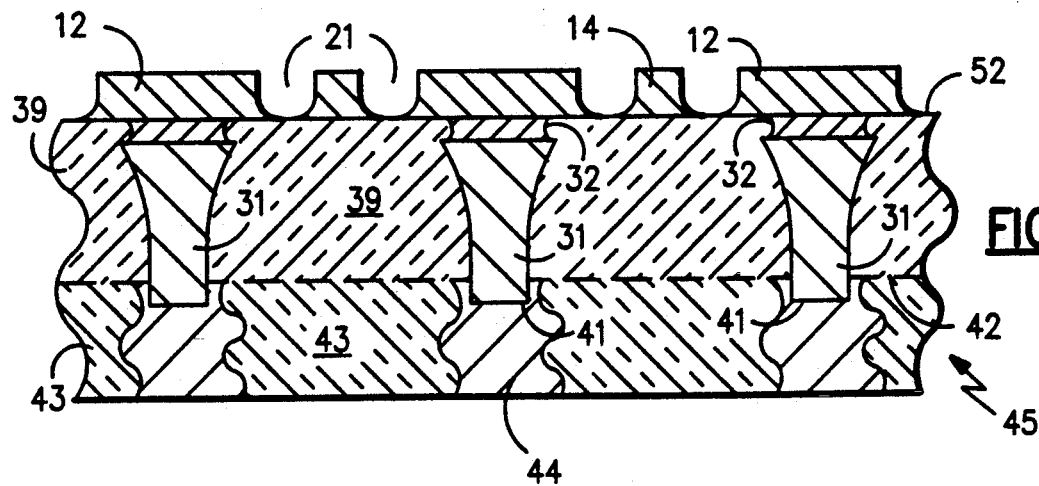
FIG. 12, illustrates the joining of the decal to a substrate or another layer.

FIG. 12, illustrates the joining of the decal as shown in FIG. 11, to a substrate 45, or another layer 45. The electrically conductive decal or the electrical connection member can be stacked or joined to another substrate or electronic package or another electrically conductive decal and then laminated. This electrically conductive decal must be joined to an organic or a fired inorganic layer or substrate 45. The decal image or features are aligned to the images or features of the substrate 45 or the next layer 45, and then joined by applying heat and/or pressure. During this joining process, the stud connection 44, of the layer or substrate 45, may fuse with the ends 41, of the decal stud 31, and the insulator 39, will join with the insulator 43, of the substrate 45. This joining of the various materials of the electrically conductive decal and the substrate will either be an adhesion or a fusion process depending upon the nature of the materials and the process conditions.

Figure 13:
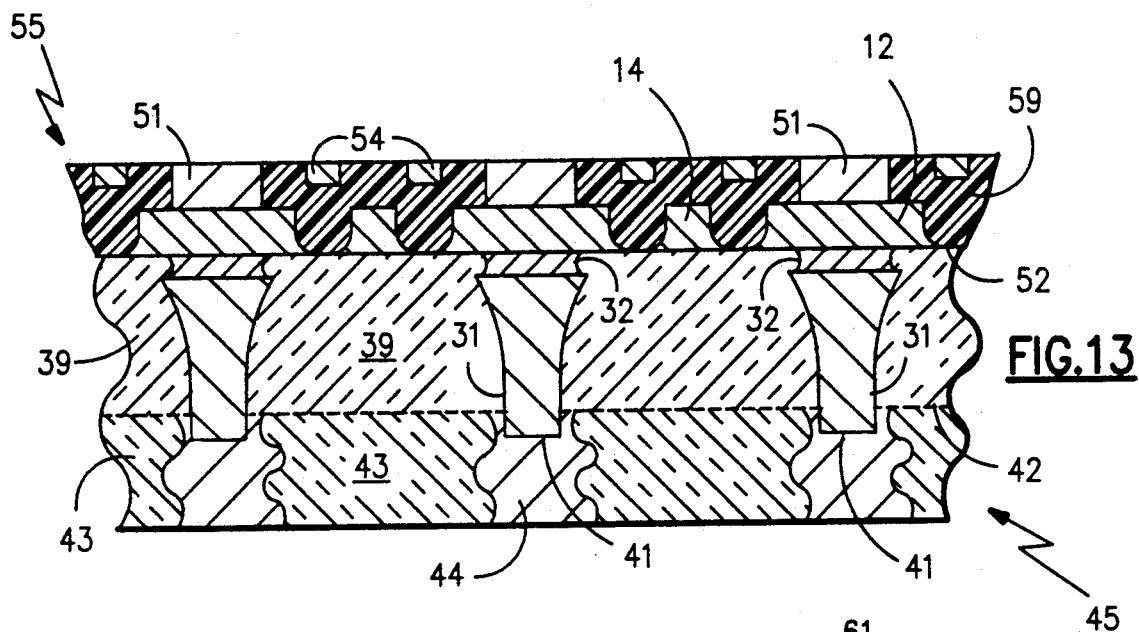
FIG. 13, shows the further processing of the decal of this invention.

FIG. 13, shows the further processing of the electrically conductive decal of this invention. The structure of FIG. 12, which has the decal joined to the layer or substrate 45, is then joined to either another structure 55, fabricated in the same fashion or a stack of layers 55, that do not require sintering. This attachment could be done by a heat and pressure lamination process, where the stud connection 51, may fuse into the stud connection 12, and the polymeric insulator 59, would adhere to the organic dielectric 39, at the boundary 52. As shown in FIG. 13, the substrate 55, could also include circuit lines 54. Again this joining process as discussed earlier would be either an adhesion or a fusion process depending upon the nature of the materials and the process conditions.

Figure 14:
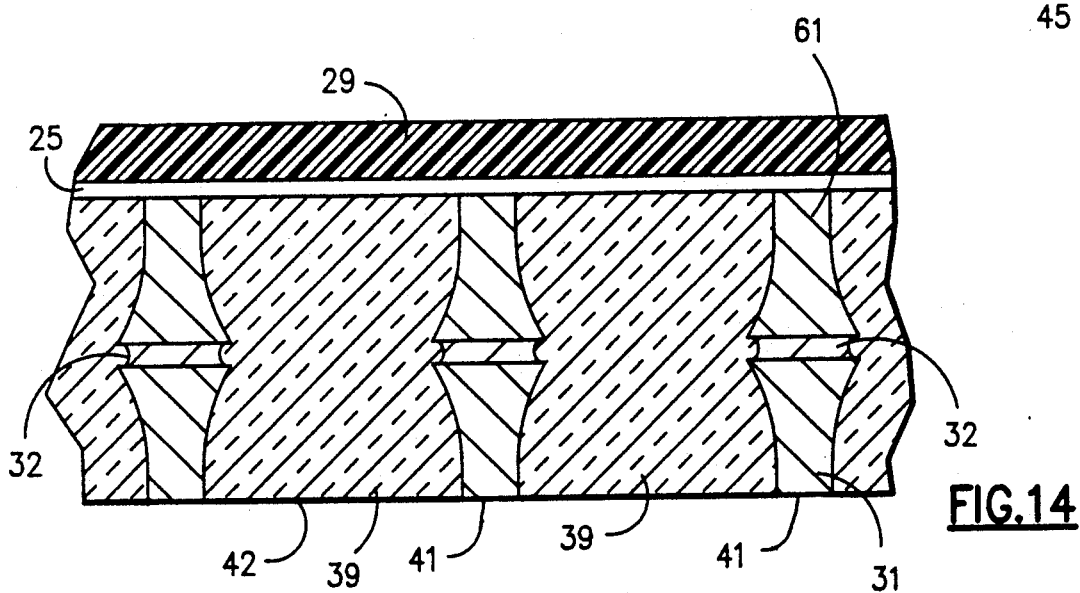
FIG. 14, illustrates another embodiment of the completed electrically conductive decal of this invention.

FIG. 14, illustrates another embodiment of the completed electrically conductive decal of this invention. The process described earlier concentrated on an electrically conductive decal filled with organic insulator material in which the two electrically conductive metal layers 13 and 15, were not of equal thickness, i.e., one side was thin for circuit patterns 14 and stud connections 12, and the other side was thick for through-via studs 31. As stated earlier the process of this invention can also be used in situations where the two electrically conductive metal layers 13 and 15, are of equal thickness. The process steps are basically the same as outlined in the preceding paragraphs, the only difference is in the end use of the product. The product could be used as a through via layer with via studs only, as there would be no circuit patterns on either side of the finished product. As shown in FIG. 14, the dielectric 39, isolates the studs 61, from each other. The studs 31 and 61, may or may not be of the same material and may or may not be of the same height or thickness. The cross-section of a finished electrically conductive decal in which both outside metal layers are of equal thickness is shown in FIG. 14. This product can now be used as a typical interconnection layer to join a fired ceramic substrate to another fired ceramic substrate, or a fired ceramic substrate to a polymeric layer or substrate, or a polymer layer or substrate to another polymer layer or substrate.

Figure 15:
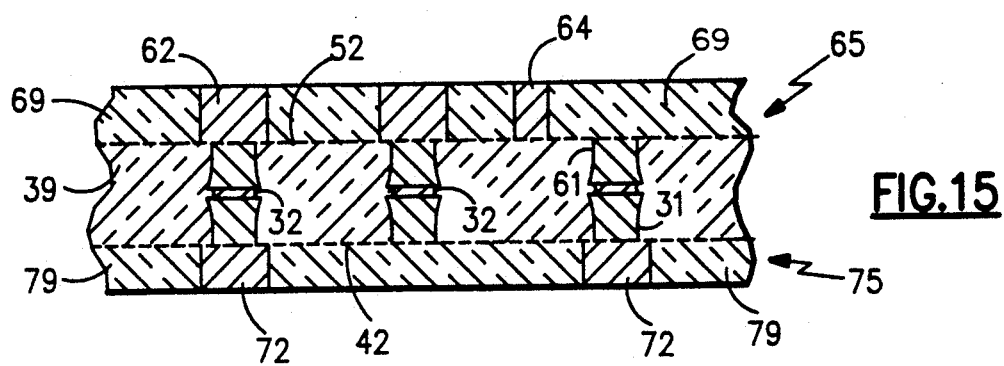
FIG. 15, illustrates the joining of an embodiment of the completed electrically conductive decal of this invention to a pair of electrical devices.

FIG. 15, illustrates the joining of an embodiment of the completed electrical connection member of this invention to a pair of substrates or electrical devices 65 and 75. The substrates 65 and 75, may have stud connections 62 and 72, respectively. Similarly, the substrate 65, may also have circuit lines 64, or the substrate 75, may have circuit lines (not shown). During the joining process the organic insulator 39, adheres to the insulator 69, at the surface 52, and to an insulator 79, at the surface 42. The completed piece can now be used to connect two circuit layers together, or a sintered substrate and a circuit layer together, or two sintered layers together, each on the opposite side of this completed piece.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

what is claimed is:

1. A process for making an electrical connection member, comprising the steps of:
    a) forming an electrically conductive substrate comprising a first electrically conductive material and a second electrically conductive material, wherein said first material and said second material sandwich at least a third electrically conductive material therebetween, and wherein the material for said third electrically conductive material is different than the material for said first and second electrically conductive materials,
    b) patterning and etching said first electrically conductive material to expose at least a portion of said third electrically conductive material and to form at least one first island of said first electrically conductive material,
    c) securing a backing material to said at least one first island,
    d) patterning and etching said second electrically conductive material to expose at least a portion of said third electrically conductive material and to form at least one second island of said second electrically conductive material, wherein said at least one second island is opposite said at least one first island, e) removing said exposed third electrically conductive material, f) filling the area created by the removal of said exposed third electrically conductive material with an organic insulator material, such that at least a portion of said at least one second island is surrounded by said organic insulator material, and g) removing said backing material and thereby forming said electrical connection member.

2. The process of claim 1, wherein said third electrically conductive material is an etch-stop material.

3. The process of claim 2, wherein said etch-stop material is selected from the group consisting of aluminum, chromium, copper, gold, molybdenum, nickel, palladium, platinum, silver, titanium, tungsten, or alloys thereof.

4. The process of claim 1, wherein said first and said second electrically conductive material is selected from the group consisting of aluminum, copper, gold, iron, molybdenum, nickel, tungsten, or alloys thereof.

5. The process of claim 1, wherein said backing material is secured to said at least one first island by means of an adhesive.

6. The process of claim 1, wherein said organic insulator material is selected from the group consisting of abs, fluoropolymers, phenolics, polycarbonates, polyesters, polyimide, polyolefins, polyvinylidinefluoride, silicones, unsaturated linear aliphatics, urethanes, vinyls, plastics or compounds thereof.

7. The process of claim 1, wherein the thickness of said first electrically conductive material is different than the thickness of said second electrically conductive material.

8. The process of claim 1, wherein the thickness of said first electrically conductive material is the same as the thickness of said second electrically conductive material.

9. The process of claim 1, wherein at least a portion of one island of said electrical connection member is joined to an electrically conductive member to form a multilayered package.

10. The process of claim 9, wherein said multilayered package comprises of at least one substrate having at least one electrical line and at least one stud connection.

11. A process for making an electrical connection member, comprising the steps of:

a) forming an electrically conductive substrate comprising a first electrically conductive material and a second electrically conductive material, wherein said first material and said second material sandwich at least a third electrically conductive material therebetween, and wherein the material for said third electrically conductive material is different than the material for said first and second electrically conductive materials, b) patterning and etching said first electrically conductive material to expose at least a portion of said third electrically conductive material and to form at least one first island of said first electrically conductive material, c) securing a backing material to said at least one first island, d) patterning and etching said second electrically conductive material to expose at least a portion of said third electrically conductive material and to form at least one second island of said second electrically conductive material, wherein said at least one second island is opposite said at least one first island, e) removing said exposed third electrically conductive material to form a third island which is cladded by said at least one first island and said at least one second island, f) filling the area around said first island, said third island, and said second island with an organic insulator material, such that at least a portion of said first island and said second island is surrounded by said organic insulator material, and g) removing said backing material and thereby forming said electrical connection member.

12. The process of claim 11, wherein said third electrically conductive material is an etch-stop material.

13. A process for making an electrically conducting package, comprising the steps of:

a) forming an electrically conductive substrate comprising a first electrically conductive material and a second electrically conductive material, wherein said first material and said second material sandwich at least a third electrically conductive material therebetween, and wherein the material for said third electrically conductive material is different than the material for said first and second electrically conductive materials, b) applying a photoresist on said first and said second electrically conductive material and patterning said photoresist, c) etching said first electrically conductive material through said patterned photoresist to expose at least a portion of said third electrically conductive material and to form a plurality of first islands from said first electrically conductive material, d) removing said photoresist from the surface of said first islands, e) applying a blanket layer of an adhesive over said first islands, f) adhering a backing material to at least one of said first islands by means of said adhesive, g) etching said second electrically conductive material through said patterned photoresist to expose at least a portion of said third electrically conductive material and to form a plurality of second islands from said second electrically conductive material, wherein at least one of said second islands is opposite at least one of said first islands, h) removing said photoresist from the surface of said second islands, i) removing said exposed third electrically conductive material, j) filling at least the area created by the removal of said exposed third electrically conductive material with an organic insulator material such that at least a portion of one of said islands is surrounded by said organic insulator material, k) securing at least one of said second islands to an electrically conducting module, and l) removing said backing material and said blanket layer of adhesive, to form said electrically conducting package.

14. The process of claim 13, wherein said third electrically conductive material is an etch-stop material.

15. The process of claim 12, wherein said etch-stop material is selected from the group consisting of aluminum, chromium, copper, gold, molybdenum, nickel, palladium, platinum, silver, titanium, tungsten, or alloys thereof.

16. The process of claim 11, wherein said first and said second electrically conductive material is selected from the group consisting of aluminum, copper, gold, iron, molybdenum, nickel, tungsten, or alloys thereof.

17. The process of claim 11, wherein said organic insulator material is selected from the group consisting of abs, fluoropolymers, phenolics, polycarbonates, polyesters, polyimide, polyolefins, polyvinylidinefluoride, silicones, unsaturated linear aliphatics, urethanes, vinyls, plastics or compounds thereof.

18. The process of claim 14, wherein said etch-stop material is selected from the group consisting of aluminum, chromium, copper, gold, molybdenum, nickel, palladium, platinum, silver, titanium, tungsten, or alloys thereof.

19. The process of claim 13, wherein said first and said second electrically conductive material is selected from the group consisting of aluminum, copper, gold, iron, molybdenum, nickel, tungsten, or alloys thereof.

20. The process of claim 13, wherein said organic insulator material is selected from the group consisting of abs, fluoropolymers, phenolics, polycarbonates, polyesters, polyimide, polyolefins, polyvinylidinefluoride, silicones, unsaturated linear aliphatics, urethanes, vinyls, plastics or compounds thereof.

* * * * *